United States Patent
Wu et al.

(10) Patent No.: US 7,577,052 B2
(45) Date of Patent: Aug. 18, 2009

(54) POWER SWITCHING CIRCUIT

(75) Inventors: Jui-Jen Wu, Hsinchu (TW); Kun-Lung Chen, Taipei (TW); Hung-Jen Liao, Hsin-Chu (TW); Yung-Lung Lin, Taichung (TW); Chen Yen-Huei, Hsinchu (TW); Dao-Ping Wang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 246 days.

(21) Appl. No.: 11/638,187

(22) Filed: Dec. 13, 2006

(65) Prior Publication Data

US 2008/0144419 A1  Jun. 19, 2008

(51) Int. Cl.
*G11C 5/10* (2006.01)

(52) U.S. Cl. .................. 365/226; 365/227; 365/228; 365/229

(58) Field of Classification Search ................. 365/226, 365/227, 228, 229
See application file for complete search history.

(56) References Cited

U.S. PATENT DOCUMENTS

| 7,245,520 B2* | 7/2007 | Bertin et al. ................. 365/151 |
| 7,362,647 B2* | 4/2008 | Wu ............................. 365/226 |
| 2007/0070769 A1* | 3/2007 | Braceras et al. ............. 365/226 |

* cited by examiner

*Primary Examiner*—Pho M. Luu
(74) *Attorney, Agent, or Firm*—K & L Gates LLP

(57) ABSTRACT

A power control circuit for an integrated circuit module includes at least one switch device coupled between a supply voltage and a power node of the integrated circuit module; and a switch control module having a first terminal coupled to the switch device, a second terminal coupled to a control signal, a third terminal coupled to a first storage node of at least one tracking cell, a fourth terminal coupled to a second storage node of the tracking cell, and a fifth terminal coupled to the power node of the integrated circuit module, for controlling the switch device to pass the supply voltage to the power node with or without a substantial voltage drop depending on an operation mode of the integrated circuit module.

18 Claims, 3 Drawing Sheets

US 7,577,052 B2

POWER SWITCHING CIRCUIT

BACKGROUND

The present invention relates generally to integrated circuit designs and more particularly to a system for controlling power to an integrated circuit module such as a static random access memory (SRAM).

Random access memory (RAM) is typically used for temporary storage of data in a computer system. There are several types of RAM, including dynamic random access memory (DRAM) and SRAM. An SRAM circuit retains its memory state without requiring any data refresh operations as long as power is supplied to the SRAM circuit. A basic SRAM cell may consist of two cross coupled inverters and two access transistors connecting the two inverters to complementary bit-lines. The two access transistors are pass-transistors, controlled by word-lines to select the cell for read or write operations. In read operation, the access transistors are switched on to allow the charges retained at storage nodes of the cross coupled inverters to be read via the bit line and its complement. In write operation, the access transistors are switched on and the voltage on the bit line and the complementary bit line are charged to a certain level to change the memory state of the cell. The SRAM cell retains one of its two possible steady states of "0" and "1" when the two pass transistors are turned off. Reading from and writing to a SRAM cell requires that the voltages on the bit-lines be sufficient to change (or "flip") the logical state of the two inverters during the time the access transistors are turned on. Conventionally, a memory cell is designed to operate with a lower supply voltage in the write operation than in the read operation because lowering the supply voltage increases the write margin of the memory cell.

FIG. 1 shows one type of conventional circuit 100 for lowering the supply voltage to an array of SRAM cells. A power control circuit 110 is connected to a core voltage supply (CVDD) and provides an intermediate supply voltage (CVDDi) to the SRAM array 120. A signal A controls PMOS device P1, such that P1 acts as a power switch between CVDD and CVDDi. In normal operation, signal A is a logical "low" such that the PMOS device P1 is turned on and CVDD is coupled to CVDDi without a substantial voltage drop. In this mode, PMOS device P2 is substantially cutoff and is non-conducting. In write operation, the signal A is raised to a logical "one" such that the PMOS device P1 is turned off and the PMOS device P2 operates as a diode to provide a voltage drop between the CVDD and CVDDi thus lowering CVDDi.

One skilled in the art would appreciate that in the conventional design of FIG. 1, there is no mechanism to determine if the operating voltage of the SRAM array is low enough to provide a reliable write operation. Accordingly, there is a need for a power control circuit that can reliably adjust the operating voltage of an integrated circuit module such as a memory cell at a desired level.

SUMMARY

The present invention discloses a power control circuit for an integrated circuit module. In one embodiment of the invention, the power control circuit includes at least one switch device coupled between a supply voltage and a power node of the integrated circuit module; and a switch control module having a first terminal coupled to the switch device, a second terminal coupled to a control signal, a third terminal coupled to a first storage node of at least one tracking cell, a fourth terminal coupled to a second storage node of the tracking cell, and a fifth terminal coupled to the power node of the integrated circuit module, for controlling the switch device to pass the supply voltage to the power node with or without a substantial voltage drop depending on an operation mode of the integrated circuit module, wherein the switch control module provides a discharge path for lowering the voltage at the power node based on the control signal until a predetermined value is written into the tracking cell.

The construction and method of operation of the invention, however, together with additional objectives and advantages thereof will be best understood from the following description of specific embodiments when read in connection with the accompanying drawings.

DESCRIPTION

Figure 1:
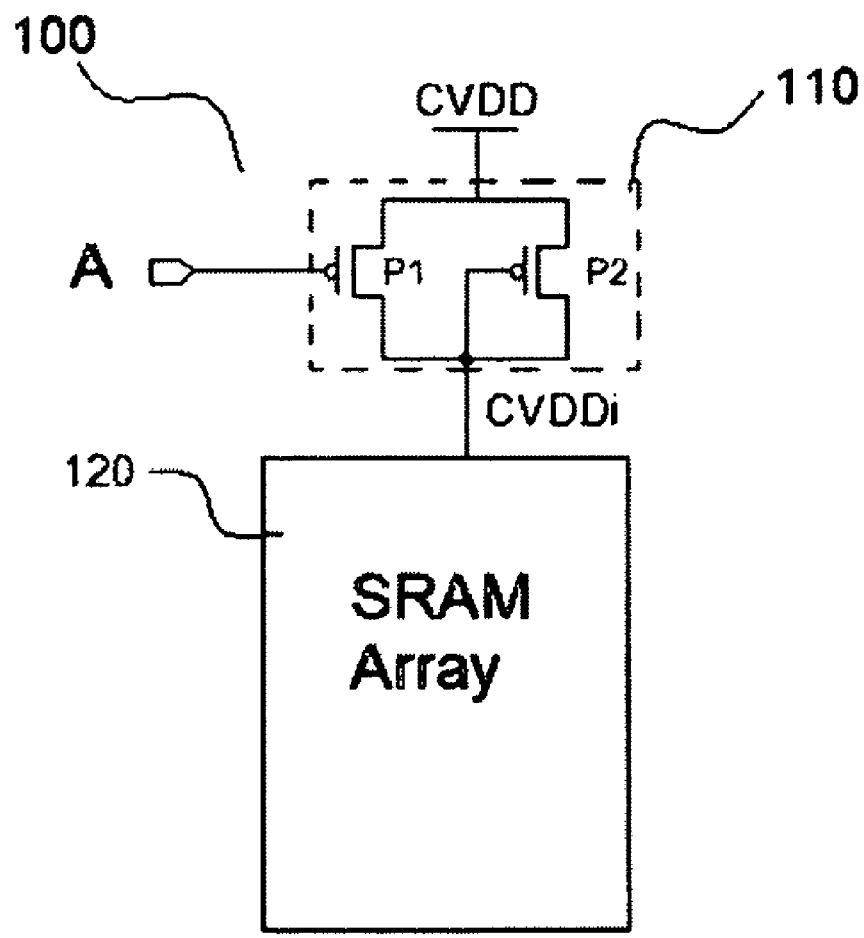
FIG. 1 illustrates a conventional power control circuit implemented for a SRAM array.

Specific examples of components and arrangements are described below to simplify the description of the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

References in the specification to "one embodiment," "an embodiment," "an example embodiment," etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure or characteristic is described in connection with an embodiment, it is submitted that it is within the knowledge of one of ordinary skill in the art to effect such feature, structure or characteristic in connection with other embodiments whether or not explicitly described. Parts of the description are presented using terminology commonly employed by those of ordinary skill in the art to convey the substance of their work to others of ordinary skill in the art.

Figure 2:
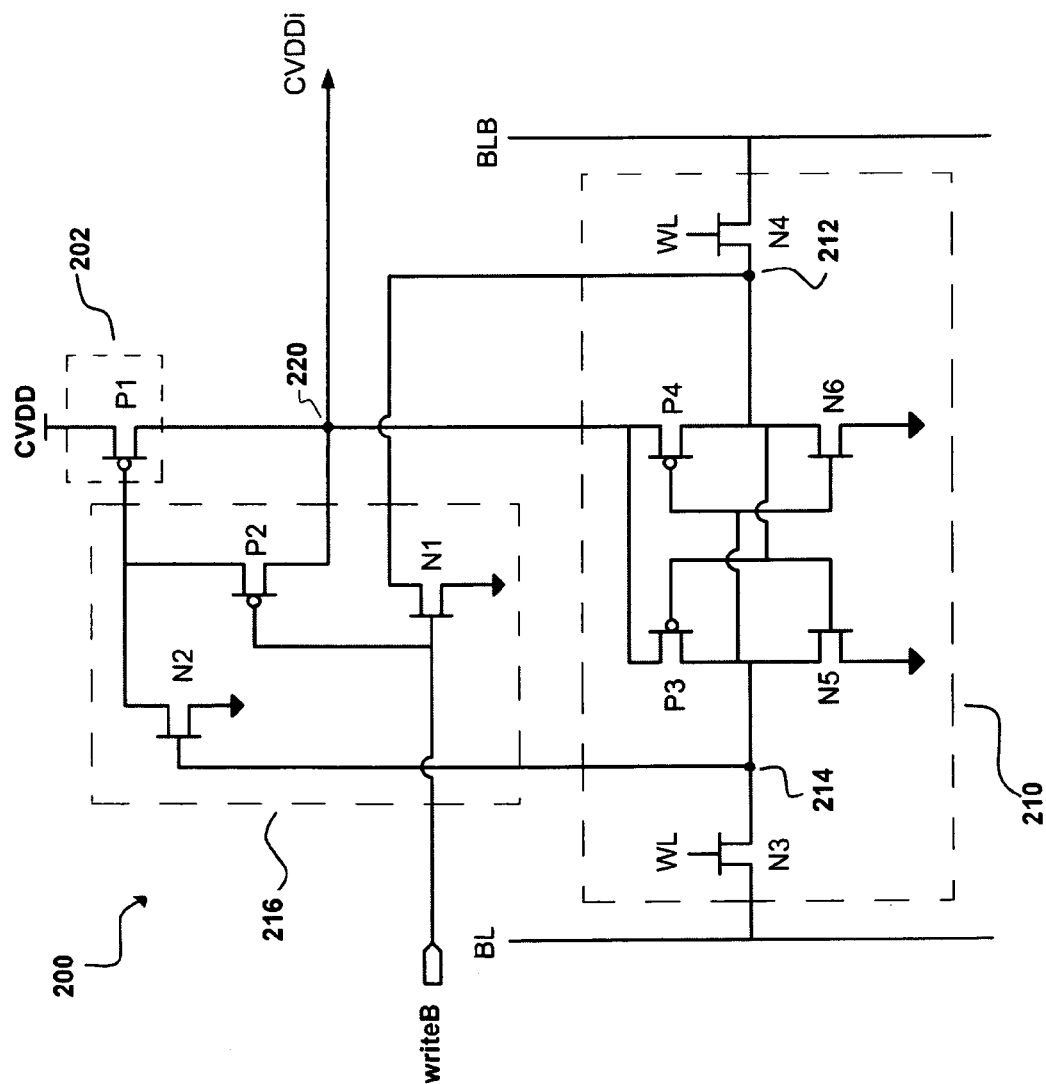
FIG. 2 illustrates a power switching circuit in accordance with one embodiment of the current invention.

FIG. 2 shows a power switching circuit 200 in accordance with one embodiment of the current invention. In FIG. 2, the power switching circuit 200 is comprised of a power switch module 202 coupled between a supply voltage CVDD and a power node 220 of one or more integrated circuit modules (not shown). These integrated circuit modules may be SRAM, DRAM or other modules which may require differing voltage levels to operate.

The power switch module 202 is controlled by a signal writeB, which may be generated externally from the circuit. The switch control module 216 has a first terminal connected to the power switch module 202, a second terminal connected to the writeB signal, and a third terminal connected to the node 220 that has a voltage level at CVDDi. The fourth and fifth terminals of the switch control module 216 are connected to a tracking cell 210. The tracking cell 210 is an SRAM cell connected to a bit line BL and its complement BLB. The tracking cell has two access NMOS devices N3 and N4 controlled by a word line WL, and connected to the bit line BL and its complement BLB, respectively. The MOS devices N5, N6, P3 and P4 together form a pair of cross-coupled inverters. The PMOS device P3 has a source connected to the node 220, a drain connected to the storage node 214, and a gate connected to the storage node 212 and further connected to the gate of the NMOS device N5. The NMOS device N5 has a drain connected to the storage node 214 and a source connected to a complementary supply voltage such as ground or VSS. The PMOS device P4 has a source connected to the node 220, a drain connected to the storage node 212, and a gate connected to the storage node 214 and further connected to the gate of the NMOS device N6. The NMOS device N6 has a drain connected to the storage node 212 and a source connected to a complementary supply voltage such as ground or VSS.

When the power switching circuit 200 is to output CVDD, the writeB signal is a logical "high", which turns on NMOS device N1, thereby providing a "low" signal to the storage node 212 of the tracking cell 210. The low signal at the node 212 forces the tracking cell 210 to a state such that a logical high signal is stored at the node 214. The logical high at the node 214 turns on the NMOS device N2 to provide a logical low signal at the gate of the PMOS device P1. This turns on the PMOS device P1 such that the voltage CVDD is passed to the node 220 without a substantial voltage drop. In other words, the voltage CVDDi at the node 220 is substantially equal to CVDD.

When the power switching circuit 200 is to output a voltage substantially lower than CVDD, the signal writeB changes to a logical low to turn off the NMOS device N1, such that the tracking cell 210 is no longer forced into a predetermined state, and can therefore be controlled by the bit lines and the word lines. Because the low writeB signal turns on the PMOS device P2 and the high voltage at the node 214 turns on the NMOS device N2, a discharge path is provided from the node 220 through the PMOS device P2 and the NMOS device N2 to the complementary supply voltage. The discharge path lowers the voltage CVDDi at the node 220. During the time when the writeB signal is a logical low, a logical low is also presented to the NMOS device N3 by the bit line BL and a logical high is presented to the NMOS device N4 by the complementary bit line BLB. The signal on the word line WL turns on the NMOS devices N3 and N4 to pass the signals on the bit line BL and the complementary bit line BLB to the storage nodes 214 and 212, respectively. Once the logical low is written to the node 214, the NMOS device N2 is turned off and the discharge path from the node 220 to the complementary supply is discontinued, thereby preventing CVDDi at the node 220 from being pulled to an unduly low level. Thus, the voltage CVDDi at the node 220 can be controlled in a range that is substantially lower than CVDD, but not unduly low.

One advantage of the current invention is that the proposed power switching circuit can output two levels of voltage. These two levels of voltage can be utilized to increase the write margin of SRAM cells.

Another advantage of the current invention is that the down-shifting level between CVDD and CVDDi can be well controlled. The voltage CVDDi is brought sufficiently low such that a "0" can be written to the tracking cell 210. Once the "0" is written, the voltage CVDDi is prevented from dropping further. Thus, the voltage CVDDi is lowered by a controllable margin.

Figure 3:
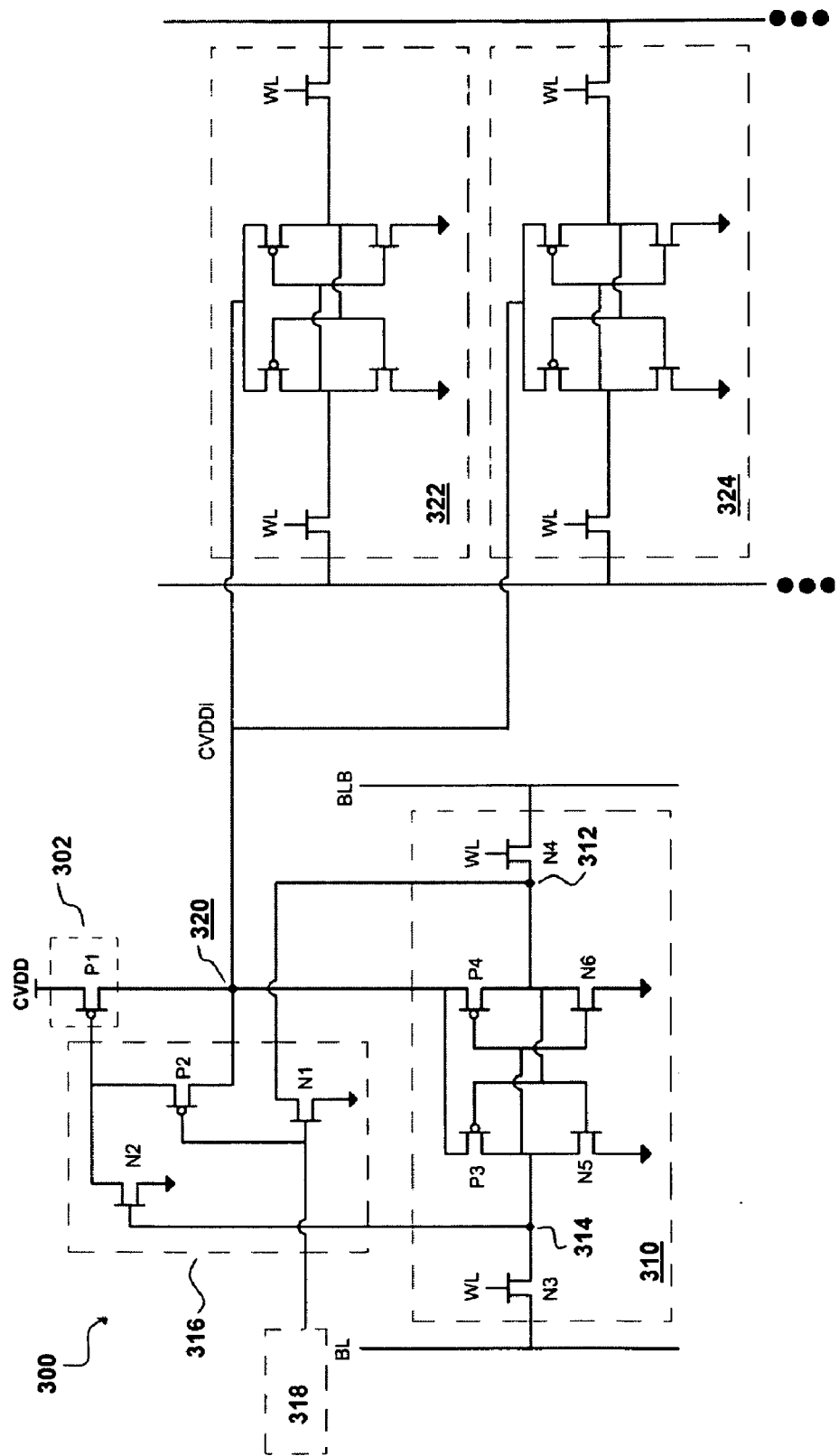
FIG. 3 illustrates a power switching circuit coupled to a memory cell array in accordance with another embodiment of the current invention.

FIG. 3 illustrates a power switching circuit 300 in accordance with another embodiment of the current invention. The power switching circuit 300 is comprised of a power switch module 302 coupled between a supply voltage CVDD and a power node 320 of one or more integrated circuit modules such as SRAM cells 322 and 324. The power switch module 302 is controlled by a signal from a switch control module 316. The switch control module 316 has a first terminal connected to the power switch module 302, a second terminal connected to a read/write control module 318 and a third terminal connected to node 320 (CVDDi). The fourth and fifth terminals of the switch control module are connected to a tracking cell 310. The tracking cell 310 is a SRAM cell connected to a bit line BL and its complement BLB. The bit lines may be connected to memory cells 322 and 324 or they may be separate. The tracking cell 310 has two access NMOS devices N3 and N4 controlled by a word line WL for connecting to the bit line BL and its complement BLB. The power switch module 302 provides the CVDDi voltage to power the tracking cell 310 and one or more integrated circuit modules such as the SRAM cells shown as 322 and 324.

In view of the foregoing, the power switch module 302 is constructed by a PMOS device P1 having its source connected to CVDD and its drain connected to node 320. The gate of P1 is controlled by a first terminal of the switch control module 316. The switch control module 316 is comprised of two NMOS devices N1 and N2 and one PMOS device P2. The PMOS device P2 has its source connected to the node 320 and its drain connected to the gate of PMOS device P1. The gate of the PMOS device P2 is connected to a gate of the NMOS device N1 and further connected to a terminal of the switch control module 316 that receives an input from the read/write control module 318. The drain of the NMOS device N1 is connected to a storage node 312 of the tracking cell 310 and the source of the NMOS device N1 is connected to a complementary supply voltage such as a ground or VSS. The NMOS device N2 has a gate connected to a storage node 314 of the tracking cell 310, a source connected to a complementary supply voltage, and a drain connected to the drain of the PMOS device P2 and further connected to the gate of the PMOS device P1.

The tracking cell 310 is comprised of two access NMOS devices N3 and N4. The NMOS device N3 is coupled between a bit line BL and the storage node 314 of the tracking cell 310, and is controlled by a word line WL. The NMOS devices N4 is coupled between a complementary bit line BLB and the storage node 312 of the tracking cell 310, and is controlled by the word line WL. MOS devices N5, N6, P3 and P4 together form a pair of cross-coupled inverters. The PMOS device P3 has a source connected to the node 320, a drain connected to the storage node 314, and a gate connected to the storage node 312 and further connected to the gate of the NMOS device N5. The NMOS device N5 has a drain connected to the storage node 314 and a source connected to a complementary supply voltage such as ground or VSS. The PMOS device P4 has a source connected to the node 320, a drain connected to the storage node 312, and a gate connected to the storage node 314 and further connected to the gate of the NMOS device N6. The NMOS device N6 has a drain connected to the storage node 312 and a source connected to a complementary supply voltage such as ground or VSS.

The gates of NMOS device N1 and PMOS transistor P2 are controlled by the read/write control module 318 for being selectively switched on or off depending on the operation mode of the memory cells 322 and 324. It is noted that although the detailed design of the write control module 318 is not shown in the figure, it is understood by people skilled in the art of integrated circuit design that it can be constructed by at least one inverter, AND, OR, NAND, NOR, XOR, or XNOR gate to provide a desired control signal controlling the devices P2 and N1. It is also noted that the power control circuit 300 may provide power to one or many different integrated circuit modules besides SRAM cells.

When the memory cells 322 and 324 are in read operation, the read/write control module 318 provides a signal that is a logical "high", which turns on the NMOS device N1 to provide a "low" signal to the storage node 312 of the tracking cell 310. The low signal at node 312 forces the tracking cell 310 to a state such that a logical high signal is stored at the node 314. The logical high at node 314 is coupled to the gate of the NMOS device N2 such that the NMOS device N2 is turned on to provide a logical low signal at the gate of the PMOS device P1. Such a low signal turns on the PMOS device P1 such that the voltage CVDD is passed to node 320 as a voltage CVDDi without a substantial voltage drop.

When the memory cells 322 and 324 are in write operation, the signal from the read/write control module 318 changes to a logical low signal to turn off the NMOS device N1 such that the tracking cell 310 is no longer forced into a predetermined state and can therefore be controlled by the bit lines and word lines. The signal from the read/write control module 318 also turns on the PMOS device P2 for providing a discharge path from the node 320 through the PMOS device P2 and the NMOS device N2 to the complementary supply voltage. The completed discharge path lowers the voltage CVDDi at node 320.

During the time when the signal from the read/write control module 318 is a logical low, a logical low is also presented to the NMOS device N3 by the bit line BL and a logical high is presented to the NMOS device N4 by the complementary bit line BLB. The signal on the word line WL turns on the NMOS devices N3 and N4 to pass the signals on the bit line BL and the complementary bit line BLB to the storage nodes 314 and 312, respectively. Once the logical low is written to the node 314, the NMOS device N2 is turned off and the discharge path from the node 320 to the complementary supply voltage is discontinued, thereby preventing CVDDi at the node 320 from being pulled to an unduly low level.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A power control circuit for an integrated circuit module comprising:
   at least one switch device coupled between a supply voltage and a power node of the integrated circuit module, wherein the switch device includes a first PMOS device having a source coupled to the supply voltage and a drain coupled to the power node; and
   a switch control module having a first terminal coupled to the switch device, a second terminal coupled to a control signal, a third terminal coupled to a first storage node of at least one tracking cell, a fourth terminal coupled to a second storage node of the tracking cell, and a fifth terminal coupled to the power node of the integrated circuit module, for controlling the switch device to pass the supply voltage to the power node with or without a substantial voltage drop depending on an operation mode of the integrated circuit module,
   wherein the switch control module includes a first NMOS device coupled between the first storage node of the tracking cell and a complementary supply voltage, having a gate controlled by the control signal, and a second NMOS device coupled between the gate of the first PMOS device and the complementary supply voltage, having a gate controlled by the second storage node of the tracking cell, and
   wherein the switch control module provides a discharge path for lowering the voltage at the power node based on the control signal until a predetermined value is written into the tracking cell.

2. The power control circuit of claim 1, wherein the integrated circuit module is a static random access memory (SRAM) or a dynamic random access memory (DRAM).

3. The power control circuit of claim 1, wherein the tracking cell is an SRAM cell.

4. The power control circuit of claim 1, wherein the first PMOS device has a gate coupled to the first terminal of the switch control module.

5. The power control circuit of claim 1, wherein the switch control module further includes a second PMOS device connected between the power node and the gate of the first PMOS device, having a gate controlled by the control signal.

6. The power control circuit of claim 5 further comprising a read/write control module coupled to the gate of the second PMOS device and the gate of the first NMOS device for generating the control signal that turns the first NMOS device on and the second PMOS device off during the read operation of the integrated circuit module, and turns the first NMOS device off and the second PMOS device on during the write operation of the integrated circuit module.

7. The power control circuit of claim 6, wherein the read/write control module comprises at least one inverter, AND, OR, NAND, NOR, XOR, or XNOR gate.

8. A memory device comprising:
   at least one memory cell;
   at least one switch device coupled between a supply voltage and a power node of the memory cell, wherein the switch device includes a first PMOS device having a source coupled to the supply voltage and a drain coupled to the power node;
   at least one tracking cell coupled to the power node; and
   a switch control module having a first terminal coupled to the switch device, a second terminal coupled to a control signal, a third terminal coupled to a first storage node of the tracking cell, a fourth terminal coupled to a second storage node of the tracking cell, and a fifth terminal coupled to the power node, for controlling the switch device to pass the supply voltage to the power node with or without a substantial voltage drop depending on an operation mode of the memory cell,
   wherein the switch control module includes a first NMOS device coupled between the first storage node of the tracking cell and a complementary supply voltage, having a gate controlled by the control signal, and a second NMOS device coupled between the gate of the first PMOS device and the complementary supply voltage, having a gate controlled by the second storage node of the tracking cell, and
   wherein the switch control module provides a discharge path for lowering the voltage at the power node based on the control signal until a predetermined value is written into the tracking cell.

9. The memory device of claim 8, wherein the memory device is a static random access memory (SRAM) or a dynamic random access memory (DRAM).

10. The memory device of claim 8, wherein the tracking cell is a SRAM cell.

11. The memory device of claim 8, wherein the first PMOS device has a gate coupled to the first terminal of the switch control module.

12. The memory device of claim 8, wherein the switch control module further includes a second PMOS device connected between the power node and the gate of the first PMOS device, having a gate controlled by the control signal.

13. The memory device of claim 12 further comprising a read/write control module coupled to the gate of the second PMOS device and the gate of the first NMOS device for generating a read/write control signal that turns the first NMOS device on and the second PMOS device off during read operation of the memory cell, and turns the first NMOS device off and the second PMOS device on during the write operation of the memory cell.

14. A power control circuit for an integrated circuit module comprising:
a first PMOS device having a source coupled to a supply voltage and a drain coupled to a power node of the integrated circuit module;
a second PMOS device having a source connected to the gate of the first PMOS device, a drain connected to the power node and a gate controlled by a control signal;
first NMOS device having a gate controlled by the control signal, a source connected to a complementary supply voltage and a drain connected to a first storage node of a tracking cell; and
a second NMOS device having a source connected to a complementary supply voltage, a gate connected to a second storage node of the tracking cell and a drain connected to the gate of the first PMOS device,
wherein the second PMOS device and the second NMOS device are selectively controlled by the control signal, the first and second nodes of the tracking cell to provide a discharge path for lowering the voltage at the power node.

15. The power control circuit of claim 14, wherein the integrated circuit module is an SRAM or a DRAM.

16. The power control circuit of claim 14, wherein the tracking cell is an SRAM cell.

17. The power control circuit of claim 14, further comprising a read/write control module coupled to the gate of the second PMOS device and the gate of the first NMOS device for generating a read/write control signal that turns the first NMOS device on and the second PMOS device off during read operation of the integrated circuit module, and turns the first NMOS device off and the second PMOS device on during write operation of the integrated circuit module.

18. The power control circuit of claim 17, wherein the read/write control module comprises at least one inverter, AND, OR, NAND, NOR, XOR, or XNOR gate.

* * * * *